United States Patent
Gambino et al.

(10) Patent No.: US 6,274,467 B1
(45) Date of Patent: Aug. 14, 2001

(54) DUAL WORK FUNCTION GATE CONDUCTORS WITH SELF-ALIGNED INSULATING CAP

(75) Inventors: Jeffrey P. Gambino, Gaylordsville, CT (US); Louis L. Hsu, Fishkill, NY (US); Jack A. Mandelman, Stormville, NY (US); Carl J. Radens, LaGrargeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/327,080

(22) Filed: Jun. 4, 1999

(51) Int. Cl.[7] .............................. H01L 21/22; H01L 21/38
(52) U.S. Cl. ............................................ 438/563; 438/301
(58) Field of Search .................... 438/563, 153, 438/328, 552, 301, 533, 558, 649, 683; 257/756, 384, 413

(56) References Cited

U.S. PATENT DOCUMENTS

| | | | |
|---|---|---|---|
| 4,997,785 | * 3/1991 | Pfiester | 437/57 |
| 5,393,676 | 2/1995 | Anjum et al. | 437/24 |
| 5,599,734 | 2/1997 | Byun et al. | 437/164 |
| 5,605,861 | 2/1997 | Appel | 437/164 |
| 5,633,177 | 5/1997 | Anjum | 438/301 |
| 5,681,771 | 10/1997 | Hwang | 437/44 |
| 5,712,176 | 1/1998 | Lytle et al. | 437/40 |
| 5,714,398 | 2/1998 | Chao et al. | 437/41 |
| 5,747,378 | 5/1998 | Fan et al. | 438/563 |
| 5,770,490 | 6/1998 | Frenette et al. | 438/199 |
| 5,773,358 | 6/1998 | Wu et al. | 438/564 |
| 5,937,289 | * 8/1999 | Bronner et al. | 438/233 |
| 6,030,876 | * 2/2000 | Koike | 438/303 |
| 6,127,707 | * 10/2000 | Chong et al. | 257/384 |

FOREIGN PATENT DOCUMENTS

| | | |
|---|---|---|
| 52-043375 | 5/1977 | (JP) . |
| 6177154 | 6/1994 | (JP) . |

OTHER PUBLICATIONS

Bassous, E., "Methods For Fabricating P+ and N+ Poly–Si Gates In A Single Poly–Si Layer For MOSFET Application", *IBM Technical Disclosure Bulletin*, vol. 25, No. 7A, Dec. 1982, pp. 3353–3356.

Sun, Y. C., "Prevention Of Boron Penetration In A Passivated P+ Polysilicon Gated MOSFET Structure", *IBM Technical Disclosure Bulletin*, vol. 34, No. 1, Jun. 1991, p. 99.

* cited by examiner

*Primary Examiner*—David Nelms
*Assistant Examiner*—Phuc T. Dang
(74) *Attorney, Agent, or Firm*—Connolly Bove Lodge & Hutz, LLP; William D. Sabo, Esq.

(57) ABSTRACT

A dual work function gate conductor with a self-aligned insulating cap and method for forming the same is provided. Two diffusion regions are formed in a substrate and a gate stack is formed over the substrate between the diffusion regions. The gate stack includes a gate insulating layer formed on the substrate and a layer of polysilicon on top of the gate insulating layer. The polysilicon layer may be doped n-type remain intrinsic. A barrier layer is formed on top of the polysilicon layer and a dopant source layer is formed on top of the barrier layer. The barrier layer contains a p-type dopant. The gate stack is enclosed by an insulating cap so that a diffusion contact can be formed borderless to the gate. Activation of the dopant source layer to dope a polysilicon layer can be delayed until a desired time.

25 Claims, 16 Drawing Sheets

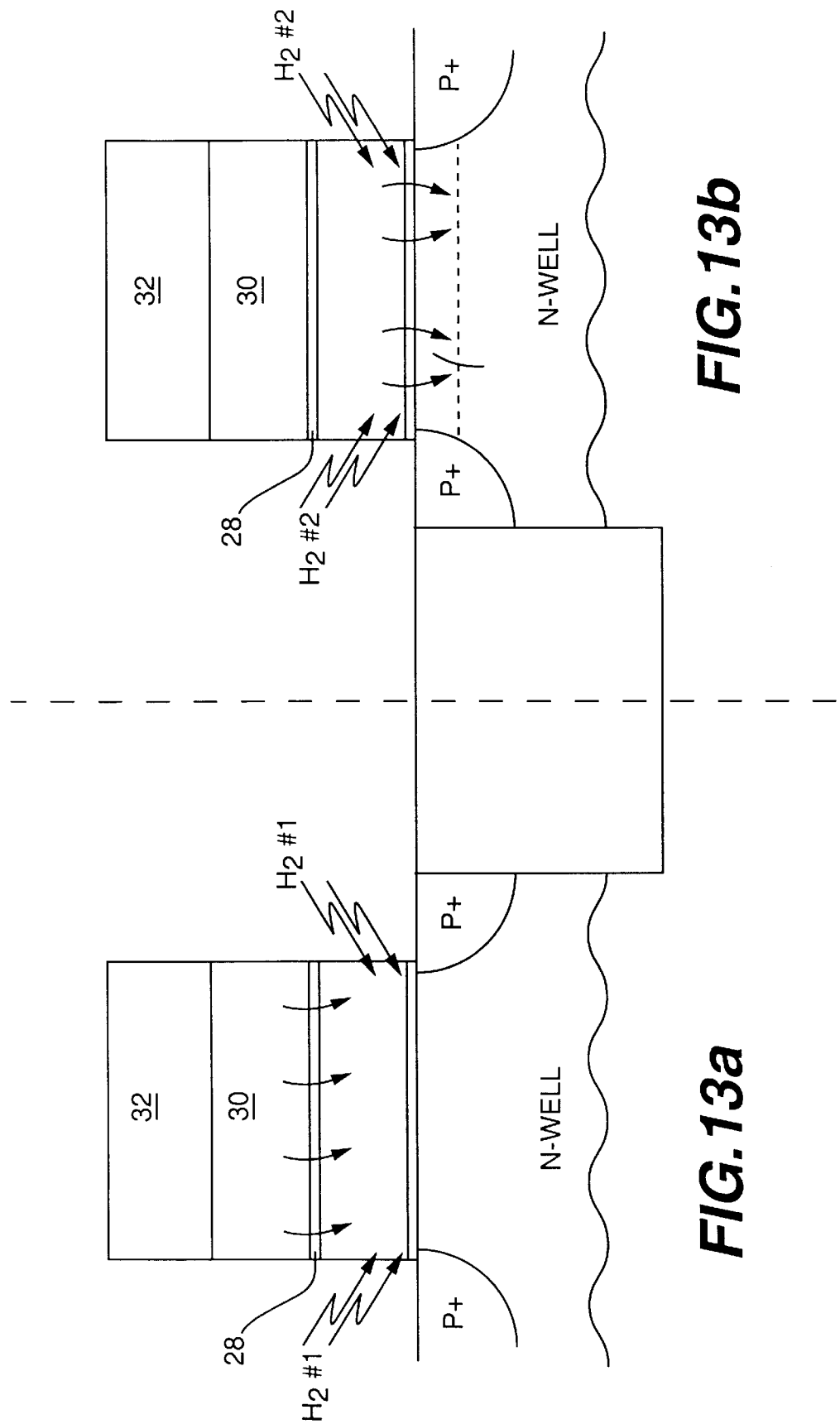

DUAL WORK FUNCTION GATE CONDUCTORS WITH SELF-ALIGNED INSULATING CAP

FIELD OF THE INVENTION

The present invention relates generally to the field of manufacturing integrated circuit chips, and more particularly to dual work function semiconductor devices and a method for producing these devices.

BACKGROUND OF THE INVENTION

Dual work function devices are becoming increasingly common in CMOS devices to provide enhanced PMOS performance. A transistor consists of a gate, a source, and a drain. In dual work function devices commonly practiced in the art, if the source and drain are doped N+, the polysilicon gate must also be doped n-type. Conversely, if the source and drain are doped P+, the polysilicon gate is doped p-type.

There are several problems which arise when forming a dual work function device. When the polysilicon gate is doped n-type or p-type, the dopant tends to penetrate the gate dielectric and enter the substrate. This limits the processing conditions used to form the device, the choice of a DRAM transfer device, as well as the materials that may be used as the gate dielectric. There are also numerous alignment problems which occur due to the additional implantation of dopants and a corresponding increase in throughput time. Several methods have been proposed for forming dual work function logic devices. However, with the ever increasing circuit densities in ULSI, it is becoming necessary to integrate high performance logic with high density DRAM. Unfortunately, the present technology for forming the gate conductors for high performance logic and high density DRAM is quite different.

FIG. 1 shows a prior art method which separately forms the PFET and the NFET in a dual work function logic device. The source/drain regions 2,3 and gates 4,5 are all doped at the same time. The gates are formed on the wells. As shown in FIG. 1, a photoresist 6 is formed over the p-well 7 and the NFET. A P+ dopant is then implanted in the n-well 8 to form the source/drain regions 2 as well to dope the polysilicon gate 4 P+. The NFET is formed in a similar manner implanting an n-type dopant with photo resist over the PFET.

U.S. Pat. No. 5,770,490 to Frenette et al. describes another method of forming a dual work function logic device. In this method, a first layer of doped material is formed over the entire substrate. The first layer is then removed in selected areas where doping opposite of the first layer is desired and a second layer of an oppositely doped material is formed over the entire surface. Drive in anneal is then performed to diffuse the dopants into the adjacent areas.

U.S. Pat. No. 5,605,861 to Appel proposes a similar solution for forming a dual work function logic device. Here, a layer of glass having a P+ dopant therein is formed over the substrate. This layer is then removed above the p-well and the polysilicon gate layer in this region is then doped n-type. The structure is heated to cause the P+dopant to diffuse from the glass into the polysilicon gate layer over the n-type region.

The known methods for forming high performance logic devices cannot be used to form high density DRAM where the transfer device is a surface channel PFET. It may be advantageous in a logic process to have a surface channel PFET transfer device as the MOSFET for a trench cell. This integrates well with the already existing P+ substrate normally used in high performance bulk silicon logic.

High density DRAM requires an insulating cap which is self-aligned to the gate conductor. This structure is necessary for forming bit line contacts which are borderless to adjacent word lines. A typical high density DRAM is shown in FIG. 2. As can be seen from FIGS. 1 and 2, the present state of the art gate stack for high performance logic device consists of a single polysilicon gate conductor 4,5, whereas the high density DRAM has a multi-layer gate stack 10. The gate stack 10 of the DRAM typically comprises a polysilicon gate conductor 11 with a metal layer 12 formed thereon for lowering the resistance of the polysilicon gate. This gate structure is then entirely enclosed on all sides by a capping layer 13. The capping layer 13 is provided so that the borderless contact stud 14 can be formed on the gate stack 10, without shorting to it. This structure with the borderless contact stud is necessary to achieve the required high densities in DRAM cell arrays.

Current processes for forming logic devices do not provide for a self-aligned insulating cap and DRAM processes are not easily amenable to dual work function gate doping. Therefore, there is a need to provide dual work function gate conductors with a self-aligned insulating cap which can be readily made for merged high performance logic/high density DRAM applications. Additionally, the borderless contact can be applied to logic to increase their standard cell density (e.g. SRAM, adder, etc.)

SUMMARY OF THE INVENTION

A method for forming dual work function gate conductors with self-aligned insulating caps for merged high performance logic/high density DRAM applications is provided. In an embodiment of the invention, two additional layers are deposited on the polysilicon gate stack prior to the cap layer needed for a borderless contact. The additional layers are a barrier layer formed on the polysilicon gate and a dopant source, which can be activated and driven into the gate electrode at a later point in the process, formed on the barrier layer.

According to another embodiment of the invention, a gate insulating layer is formed on a substrate. An undoped layer of polysilicon is then deposited on top of the gate insulating layer and a barrier layer is formed on top of the polysilicon. A dopant of a first conductivity type is then implanted into selected areas of the polysilicon. Alternatively, the steps of forming the barrier layer and of implanting the dopant may be reversed if desired. Next, a second layer containing a dopant of a second conductivity type is formed on top of the barrier layer and a capping layer is formed over the second layer. Gate stacks are defined and etched and the dopant of the second conductivity type is driven from the second layer through the barrier layer into the polysilicon layer.

In another embodiment of the invention, a layer of silicide is formed between the polysilicon layer and the barrier layer.

According to another embodiment of the invention, the dopant is driven from the second layer through the barrier layer and into the underlying polysilicon by a hydrogen anneal.

In another embodiment of the invention, wet or steam oxidation is used to form an oxide layer on the sidewall of the gate stacks, as well as to help drive the dopant into the polysilicon due to the presence of hydrogen.

In another embodiment of the invention, a silicon nitride spacer is formed on the gate stacks after they have been defined and etched. The silicon nitride spacers are removed from selected gates in which it is desired to alter the doping of intrinsic polysilicon gate layer. Wet or steam oxidation is then performed to form the sidewalls, as well as to drive the dopant into the polysilicon in those gate stacks which had the silicon nitride spacers removed.

In a further embodiment, a multiple anneal process is used to form enhancement and depletion mode devices on the same substrate.

BRIEF DESCRIPTION OF THE DRAWINGS

FIG. 12b illustrates current versus voltage graphs of the types transistors formed in FIG. 12a;

FIGS. 13a and 13b are a cross-section of a semiconductor device subjected to multiple anneals;

DETAILED DESCRIPTION OF THE INVENTION

Figure 3:
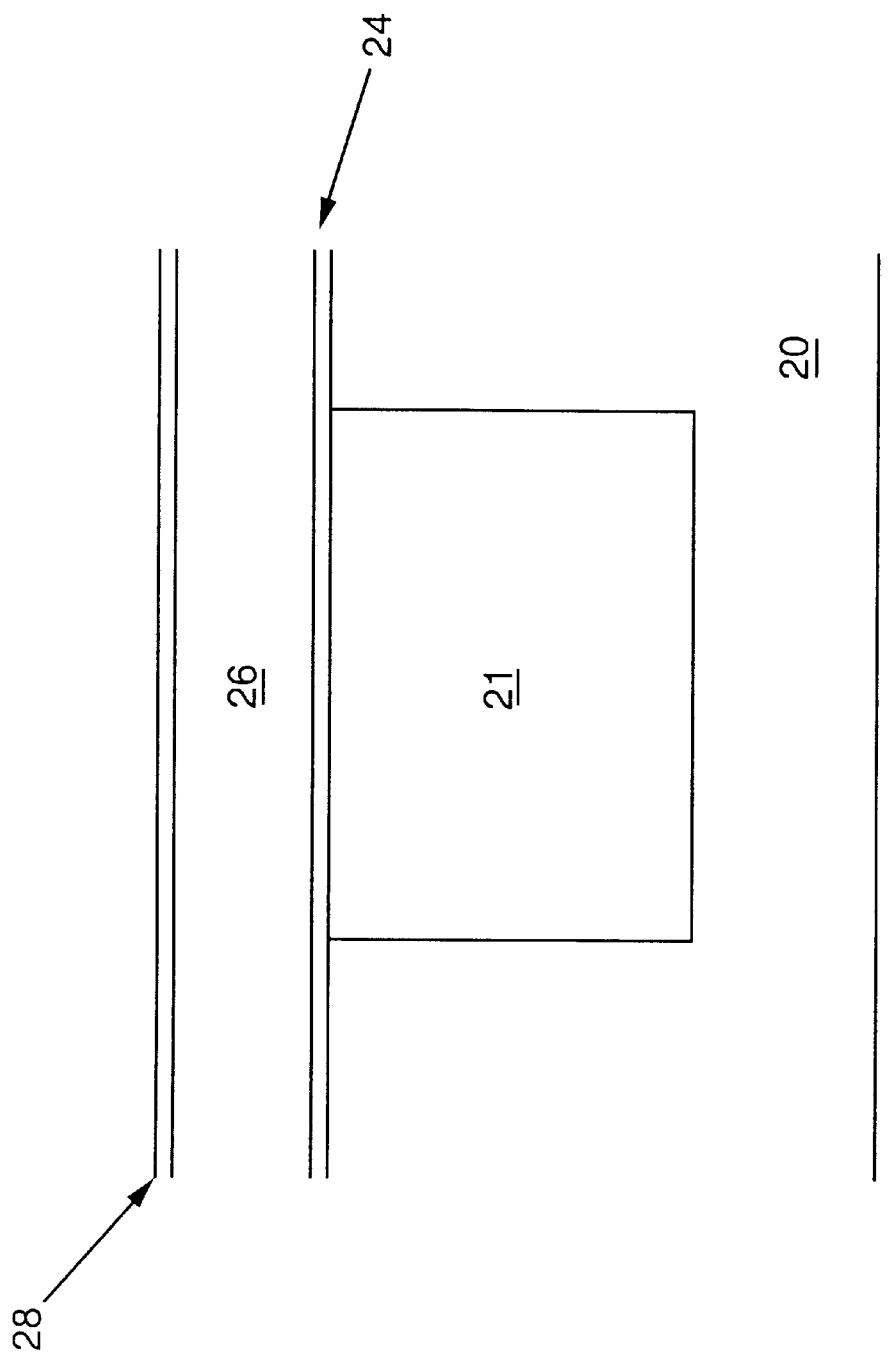
FIGS. 3–7 illustrate the process steps used in forming a device according to the invention.
Figure 8:
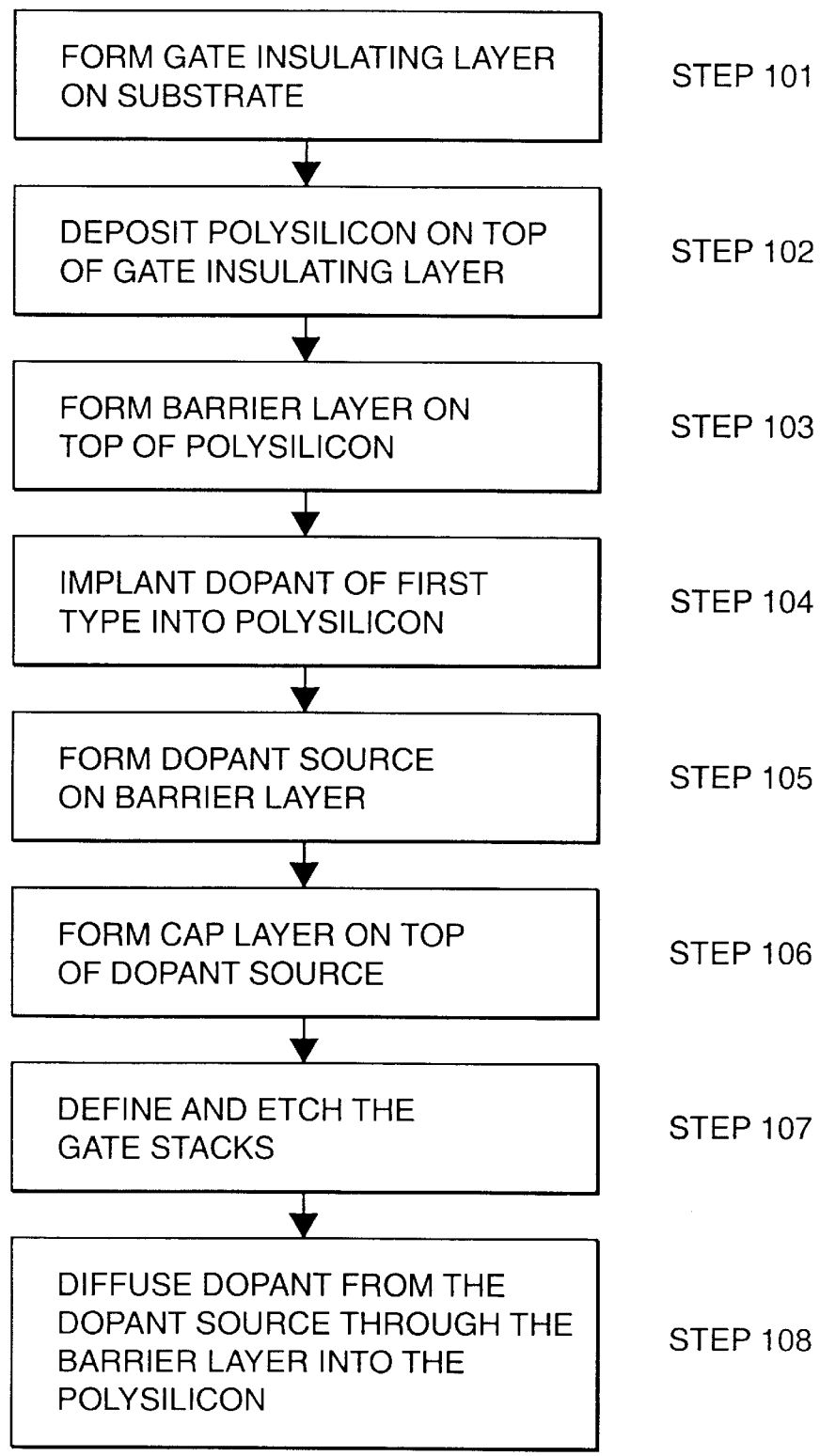
FIG. 8 is a process flow showing the steps of the method of the present invention.

The present invention provides dual work function gate conductors with self-aligned insulating caps for merged high performance logic/high density DRAM application and methods for forming the same. The invention is implemented in the context of conventional semiconductor device manufacture. Two new layers, a barrier layer and a dopant source, are deposited on the polysilicon gate stack prior to the cap layer. The polysilicon gate conductor is separated from the dopant source by the barrier layer. The cap layer is then formed on top of the dopant source. This structure provides a dopant source for doping the polysilicon gate conductors which can be activated and driven into the polysilicon gate conductor at a later point in the process. In this way, the borderless cap necessary for high density DRAM is preserved and dopant penetration through the gate insulator into the substrate is eliminated.

referring now to FIG. 3 and the process flow of FIG. 8, well regions are defined in a silicon substrate 20 with an isolation region 21 formed between the well regions. The isolation used in this embodiment is shallow trench isolation 21, although other types of isolation may be used. Following step 101, a gate insulating layer 24 is formed over the surface of the substrate 20. The gate insulating layer 24 may be a single dielectric layer or it may consist of multiple dielectric layers, for example, an NO or an ONO film. The thickness, type and existence of any gate insulating layer will vary depending on the particular process. A layer 26 of intrinsic polysilicon is deposited on top of the gate insulating layer 24 and a barrier layer 28 is formed on layer 26 according to steps 102 and 103. The barrier layer 28 is preferably an oxide layer between about 5 and 15 nanometers thick. Each of the above described layers are preferably formed over the entire surface of the substrate 20.

Figure 4:
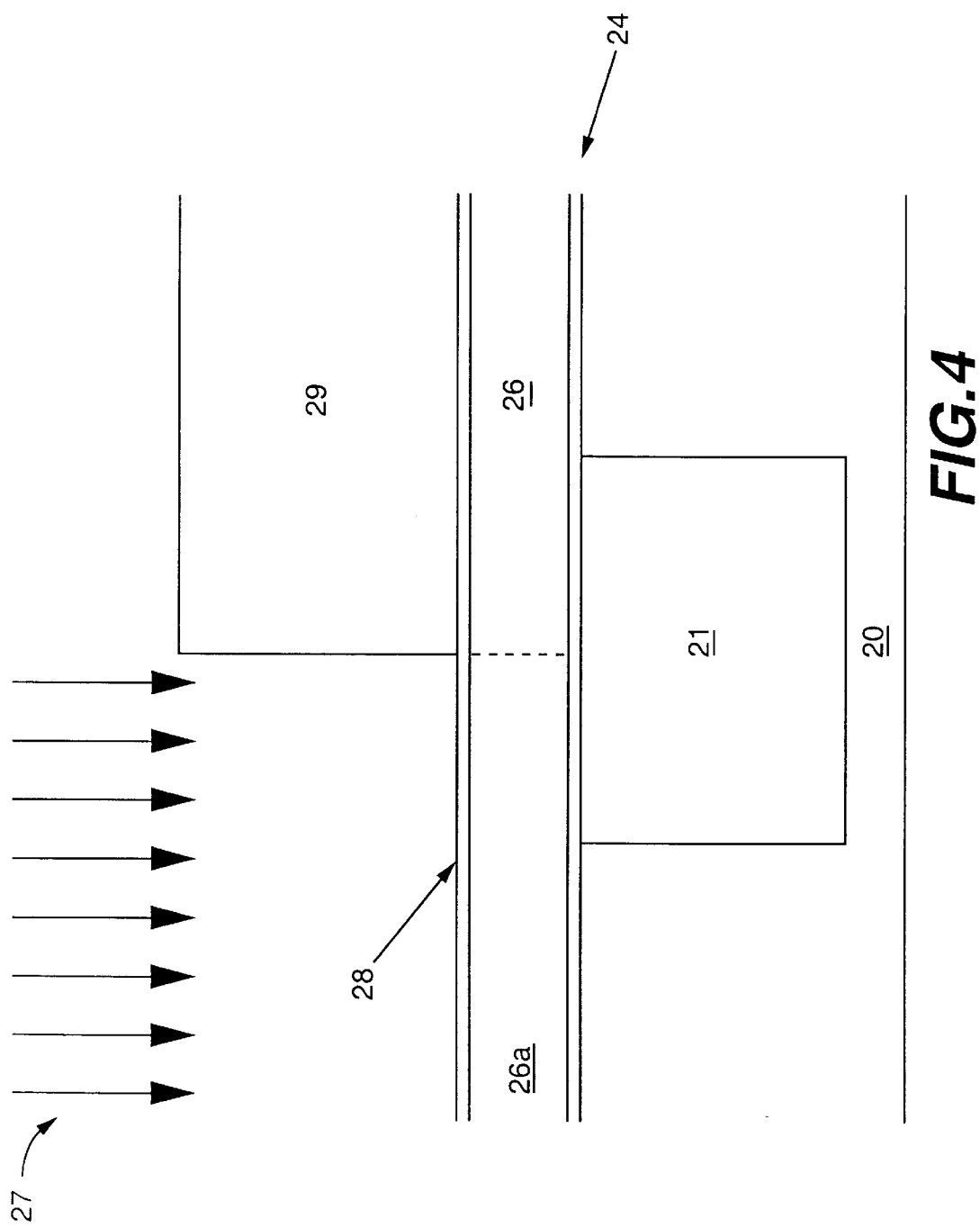

In step 104, an N+ dopant 27 is implanted into selected areas of the intrinsic polysilicon layer 26 as shown in FIG. 4. A standard DRAM or logic gate mask is used to define N+ polysilicon regions 26a and photoresist 29 is patterned. The N+ dopant 27 is then implanted into areas 26a of the polysilicon 26 selected to be doped n-type, for example those areas where NFETS are to be formed. The dose of the N+ implant is preferably sufficiently high so that the N+ doping concentration in the polysilicon area 26a is not compensated by the subsequent activation of the P+ dopant source described below with regard to step 108. In an alternative embodiment, the steps of implanting the N+ dopant, step 104, and forming the barrier layer 28, step 103, may be reversed.

Figure 5:
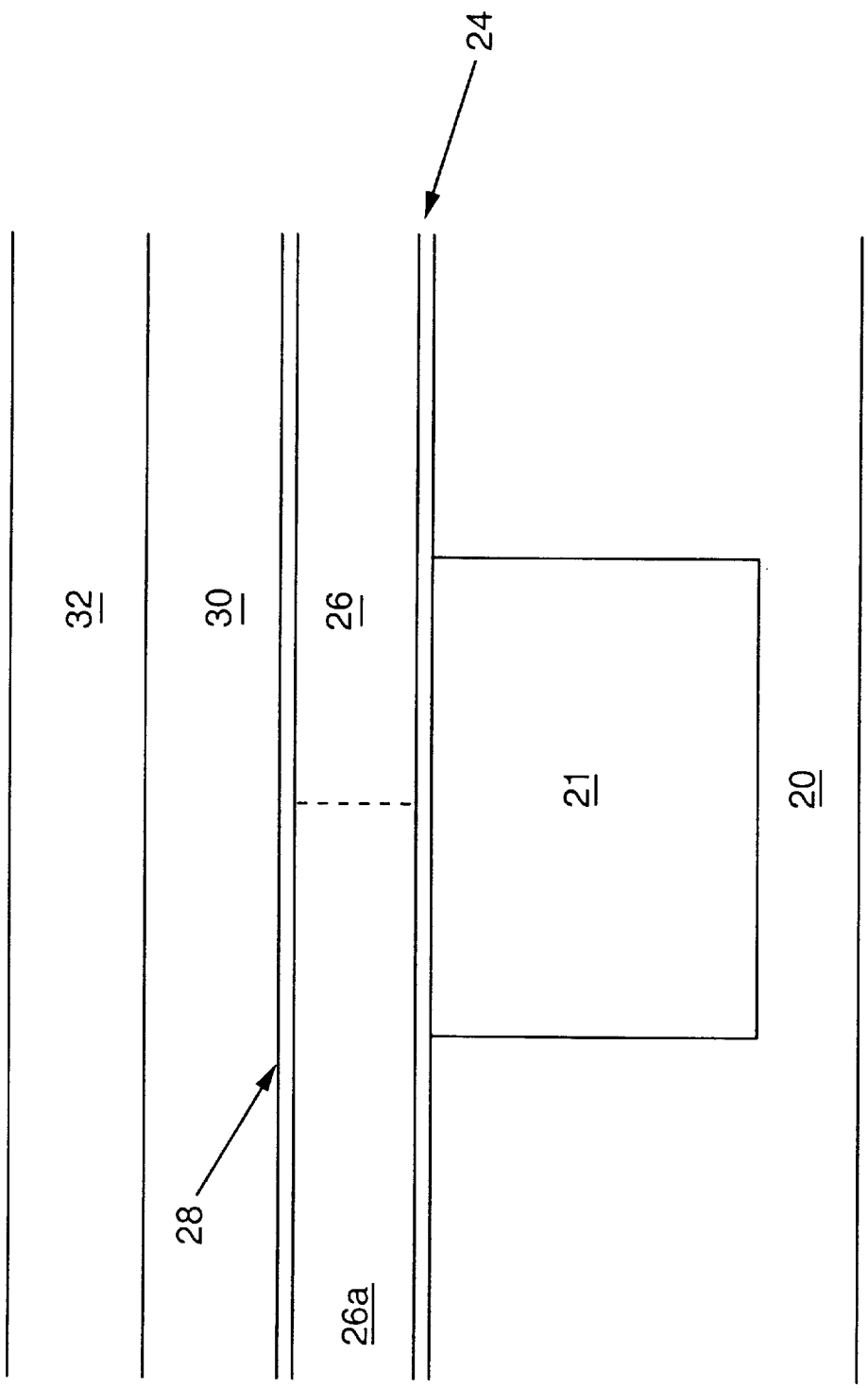

Next, the photoresist 29 is removed and a layer of dopant source 30 is formed on the thin barrier layer 28 according to step 105 as shown in FIG. 5. The dopant source 30 is a layer, for example, of glass which may contain P+ impurities, for example, boron. Typical glasses or films which may be used as the dopant source 30 include BSG, SiGeB, $TiB_2$, $B_2O_3$, B-doped polysilicon and B-doped silicides. The dopant source 30 should be sufficiently thick so that it is not depleted of dopant during the subsequent dopant activation in step 108. The exact thickness of the layer of dopant source 30 will vary depending on the thickness of the polysilicon layer 26.

Figure 6:
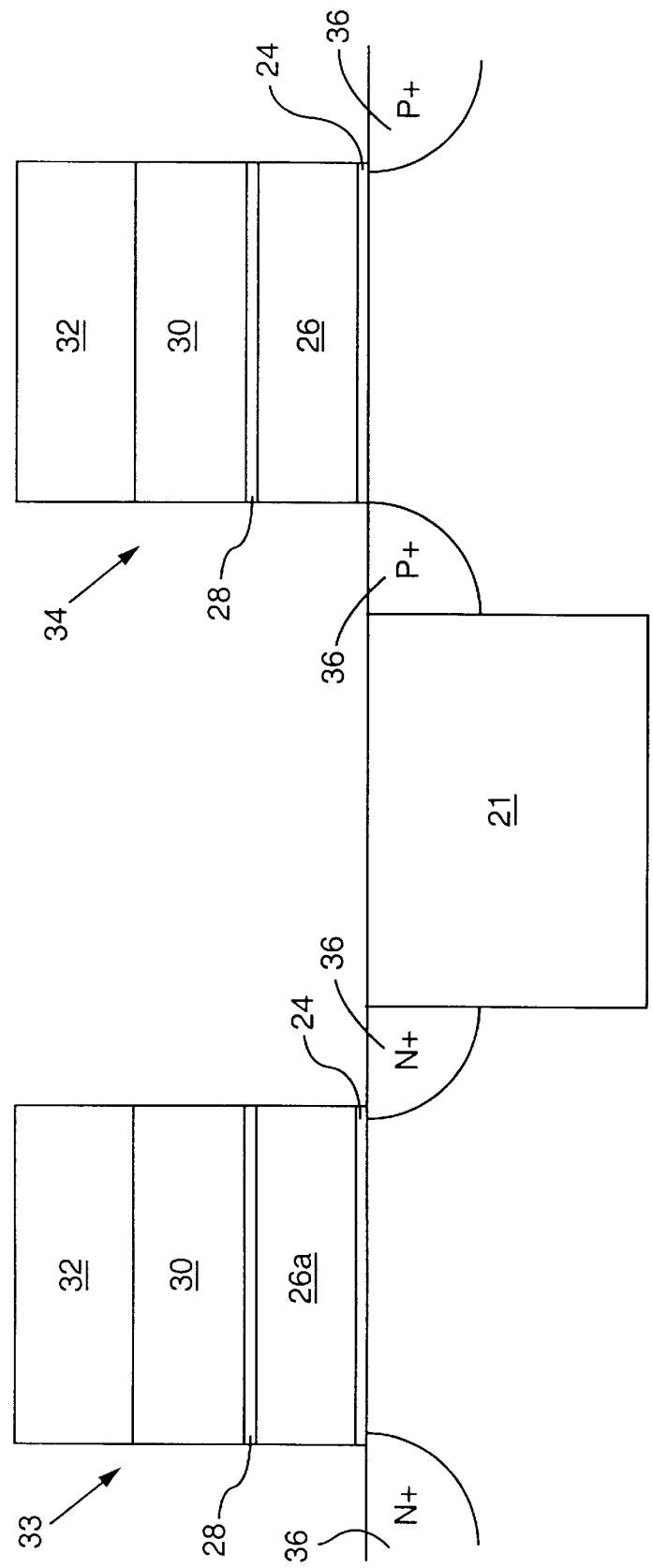

A capping layer 32, preferably made of silicon nitride, is then deposited on the dopant source 30, step 106. Standard gate definition and etching is performed per step 107, resulting in the gate stacks 33, 34 shown in FIG. 6. Source and drain diffusion regions 36 may now be implanted. However, it is not necessary that the source/drain regions be activated at this time. Additionally, it is preferable that there are no hot process between 700° C. and 1000° C.

The process up to this point has been conducted in the absence of hydrogen. By providing the barrier layer 28 and conducting the process as described above, the P+ dopant remains trapped in the dopant source 30 so it does not penetrate the thin barrier layer 28. In this way, it is possible to delay doping of the P+ gate conductors until a desired time.

Figure 7:
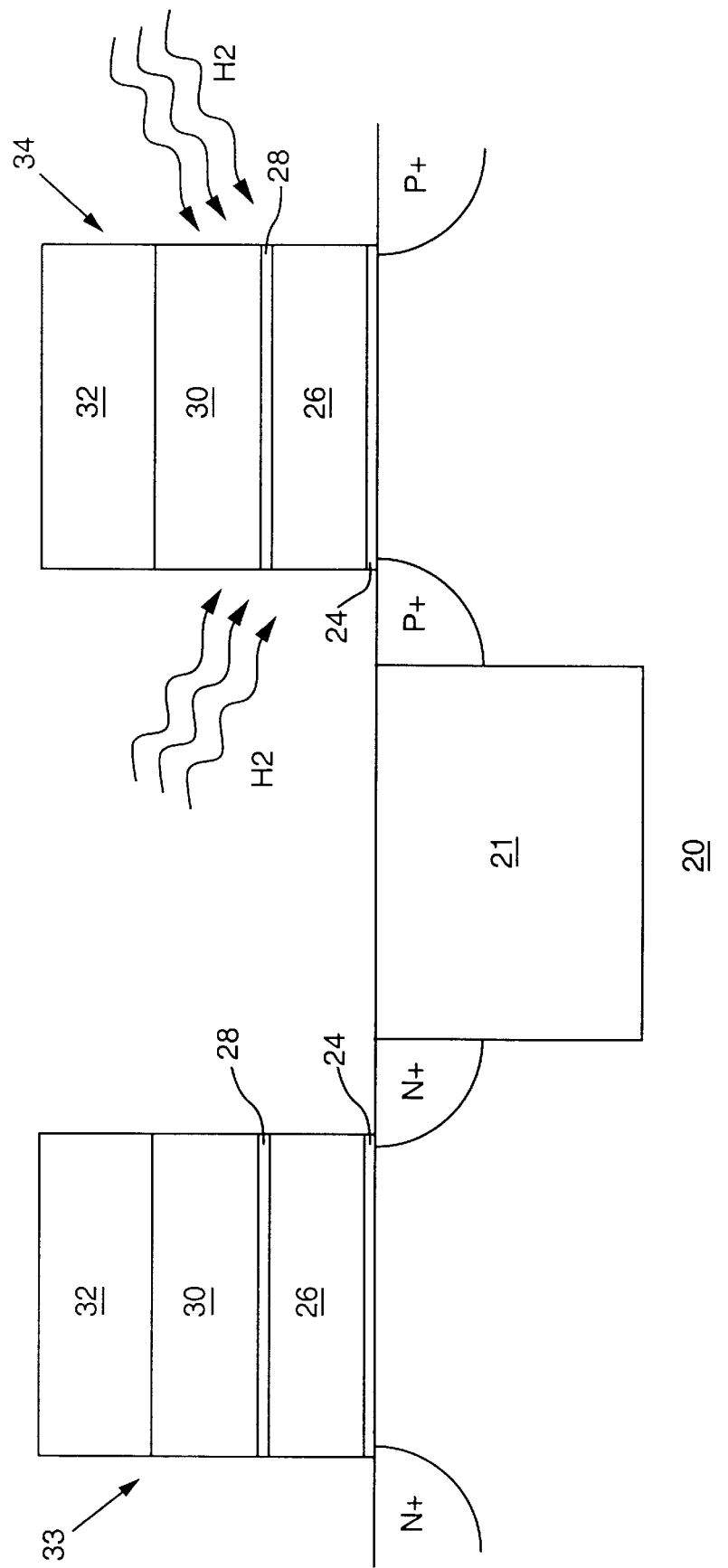

Then, at the desired time, step 108 is performed and a hydrogen anneal is preferably used to activate the P+ dopant to diffuse from the dopant source layer 30 through the barrier layer 28 into the polysilicon 26, 26a as shown in FIG. 7. Although only shown on gate stack 34 in the figures the diffusion of dopant from dopant source 30 will occur in both gate stacks 33, 34. However, only those devices where it is desired to have a P+ gate should be affected by the hydrogen anneal as the dose of the N+ dopant implanted into polysilicon 26a in step 104 was chosen to be sufficiently high to prevent counter doping of the N+ polysilicon during step 108. The combination of the gate insulating layer 24 and the barrier layer 26 prevents the P+ dopant from entering the substrate 20 during this step. Additionally, when the capping layer 32 is made from silicon nitride, the type of silicon nitride used can influence the content of ambient hydrogen during drive-in step 108. Therefore, it is possible to control the diffusivity of the P+ dopant with the amount of hydrogen in the silicon nitride of cap layer 32. For example, PECVD nitride has a high concentration of hydrogen, whereas LP and HDP nitrides have lower hydrogen content and would be used when a low diffusivity is desired.

After drive-in of the dopant into the polysilicon in step 108, the gate conductor polysilicon 26a, 26 is activated in a controlled manner within the thermal budget and the fabrication of the device may continue in a standard manner.

Figure 9:
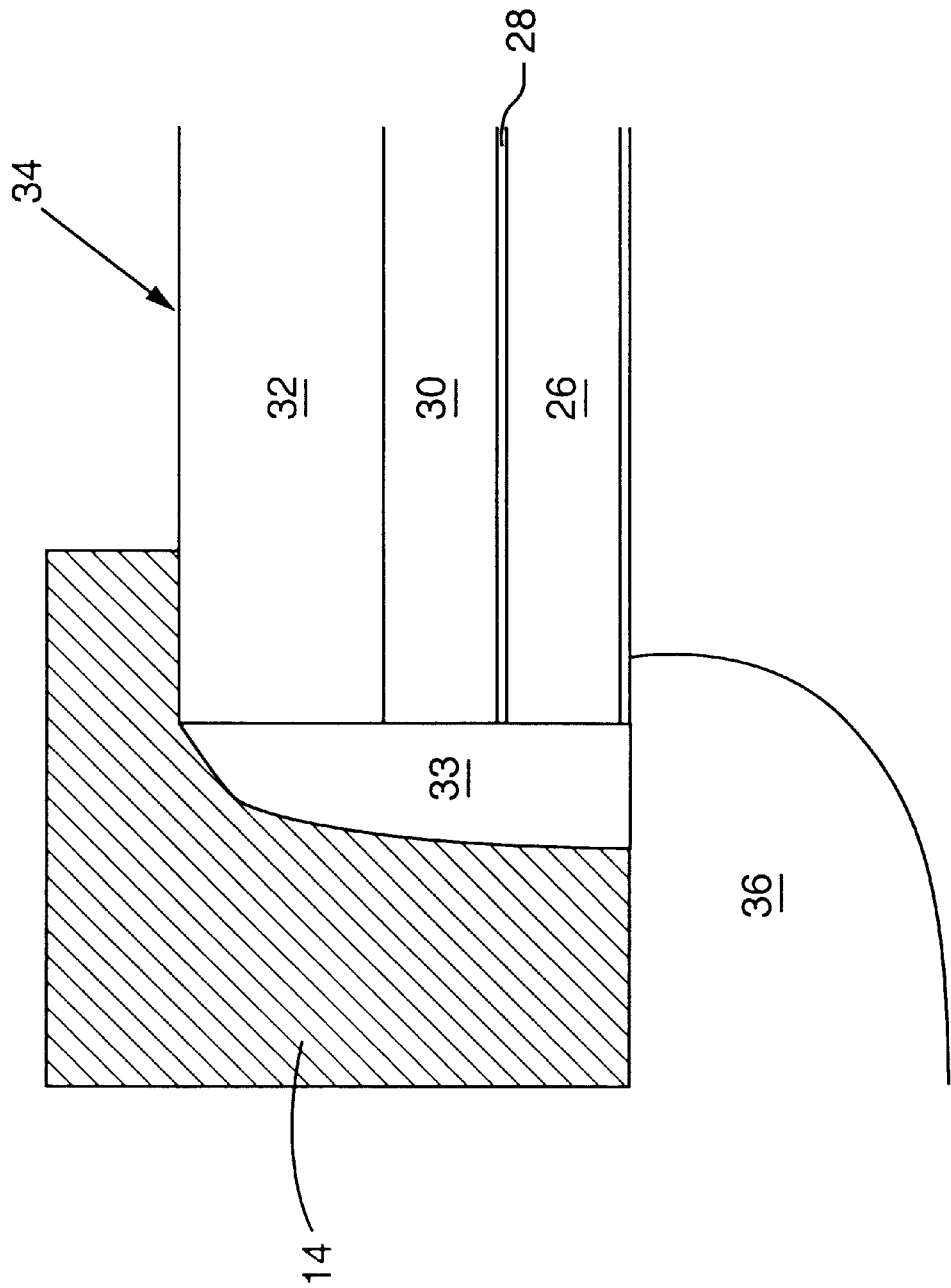
FIG. 9 is a cross-section of a semiconductor device which may be formed using the method of the present invention.

Utilizing the above-described method, it is possible to form the new structure shown in FIG. 9. This structure has a gate conductor 26 made from P+ polysilicon and allows a contact to the diffusion regions which is borderless to the gate. The gate stack is formed over the substrate between the P+ diffusion regions. The gate stack includes a gate insulating layer 24 formed on the substrate 20 and the P+ polysilicon gate conductor 26 on top of the gate insulating layer 24. The P+ polysilicon is formed using the two additional layers, the barrier layer 28 and the dopant source layer 30. A cap layer 32 is formed on top of the dopant source layer and a silicon nitride spacer 33 is formed on the sides of the gate stack. This structure allows the contact stud 14 to contact the diffusion region 36 and be borderless to the gate, that is formed on top of the gate stack 34 without shorting to it. Note that the contact to the gate conductor is identical for N and P gates as the stack height is preferentially not altered for either electrode. This also allows for a uniform source/drain etch and contact process.

Figure 10:
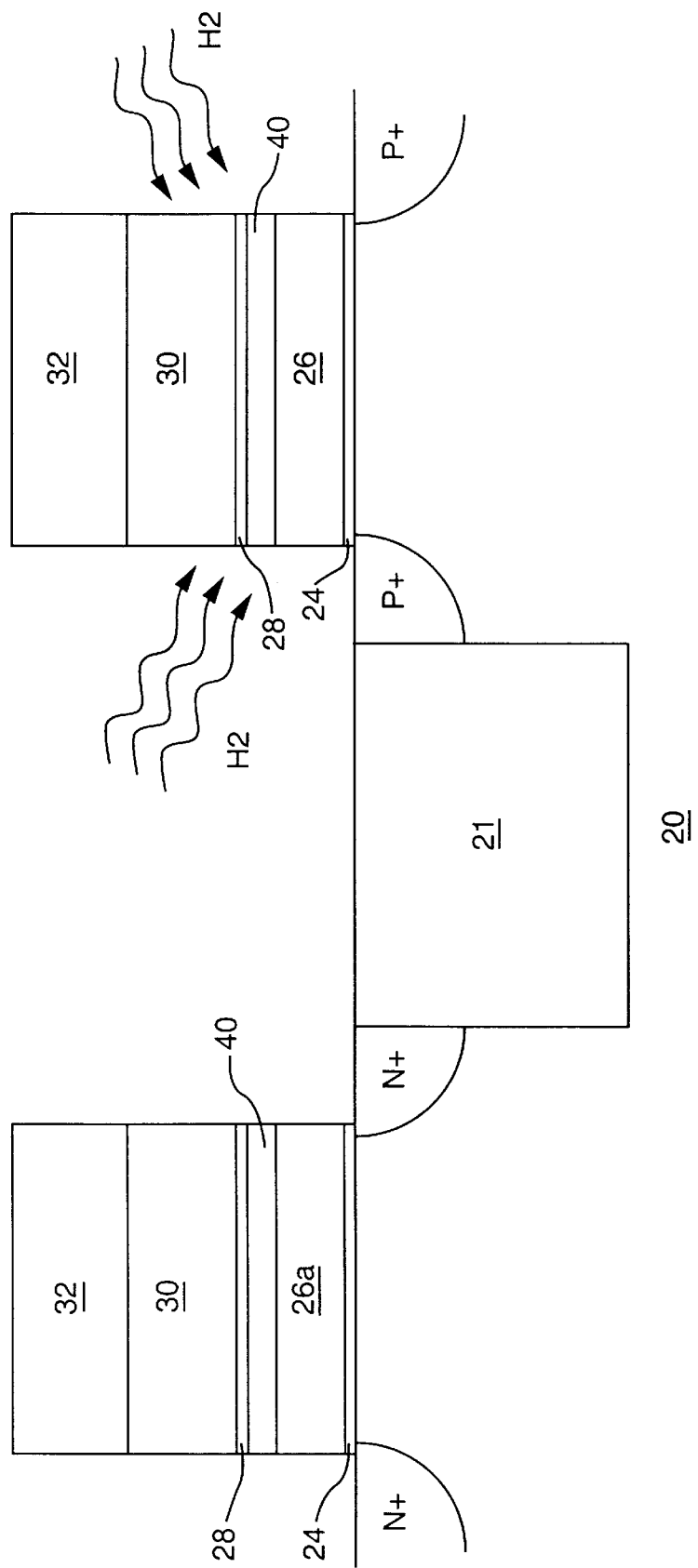
FIG. 10 is a cross section of a semiconductor device of an alternative embodiment of the present invention.

In addition to the above described method and structure, an additional silicide layer may be used to facilitate the distribution of the P+ dopant through the polysilicon. A layer which has a very high diffusion of dopant, such as tungsten silicide is used. Including a silicide layer has the added advantage of reducing the resistance of the gate electrode for approximately 100 $\Omega/\square$ to approximately 3–$\Omega/\square$. As shown in FIG. 10, the thin silicide layer 40 is formed on top of the polysilicon layer 26 and the barrier layer 28 is formed on top of the silicide layer 40. The process of FIG. 8 is modified in that after step 102, a step of forming the silicide layer is inserted. The remaining structure of the invention and process steps remain the same and are described above.

Figure 11:
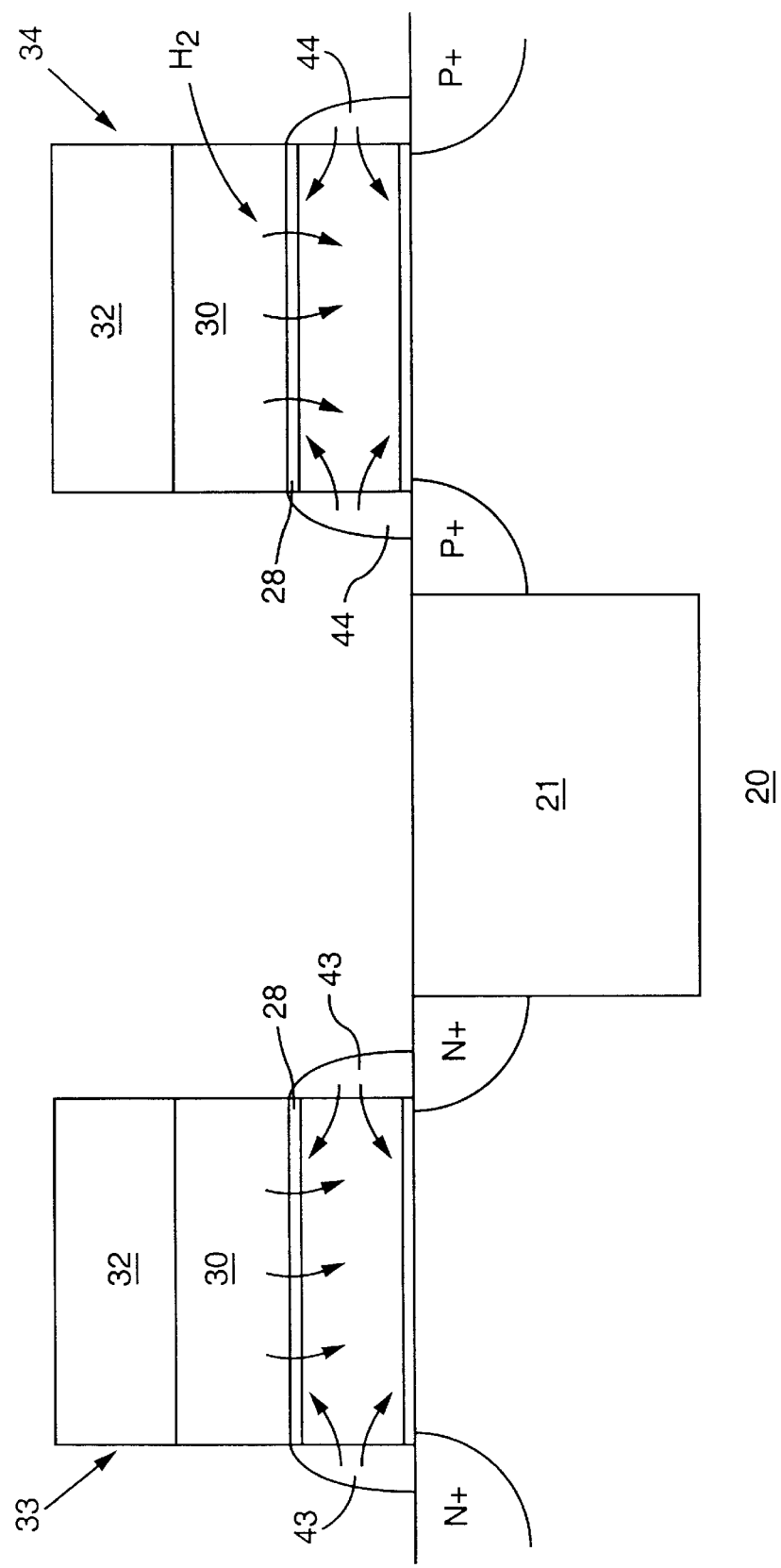
FIG. 11 illustrates a semiconductor device formed using wet or steam oxidation.

Referring now to the activation of the dopant source, in addition to the above described hydrogen anneal, there are several different ways in which step 108 can be carried out, that is, ways in which the P+ dopant can be driven into the polysilicon. In addition to the hydrogen anneal, a wet or steam oxidation process may be used. As shown in FIG. 11, wet or steam oxidation is performed in a known manner to grow sidewall spacers 43, 44 on the gate stacks 33, 34. During the formation of the sidewall spacers, the hydrogen from the steam is present in sufficient amounts so that at the same time the sidewalls spacers are formed, the hydrogen from the steam penetrates the barrier layer and the polysilicon and encourages boron diffusion through the barrier layer 28 into the intrinsic polysilicon 26. The hydrogen enters the polysilicon and degrades the barrier layer as indicated in FIG. 9. In this embodiment, it is not necessary to introduce additional hydrogen during step 108.

Figure 12A:
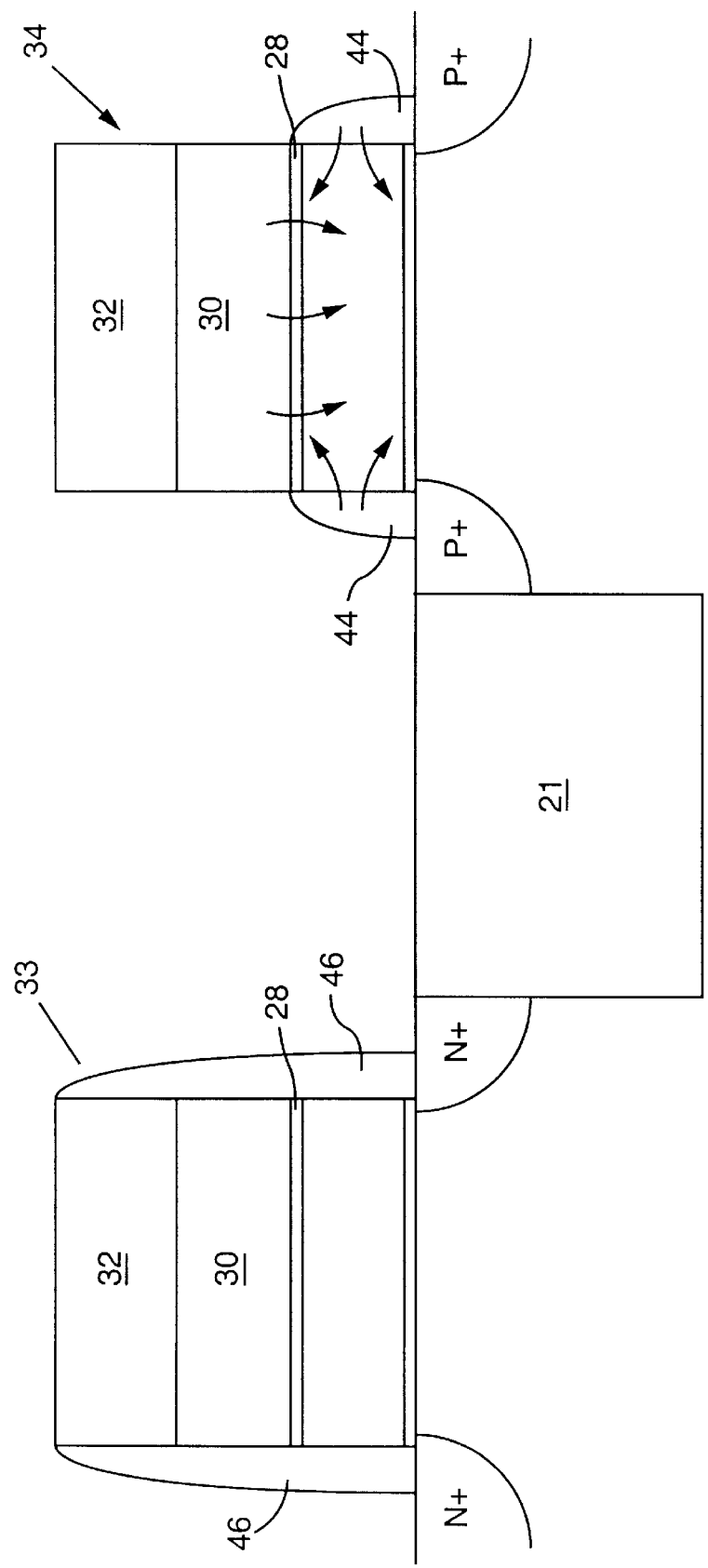
FIG. 12a is a cross-section of a semiconductor device having positive spacers as well as spacers which have been grown.

Turning now to FIG. 12a, another embodiment in which a positive spacer, such as a silicon nitride spacer, is preferably formed on all the gate stacks after they have been etched is illustrated. The positive spacer is preferably formed on the entire sidewall of the gate stacks. The silicon nitride spacer is then removed from selected gate stacks which are desired to have the polysilicon layer doped to P+. The wet oxidation step to form the sidewall spacer or the hydrogen anneal, both described above, are then performed. The hydrogen will only affect those gate structures with the silicon nitride spacers removed.

FIG. 12a shows a stack 33 which has a silicon nitride spacer 46 formed on its sides and a stack 34 which has had the silicon nitride spacer removed. A sidewall spacer 44 has been formed by wet or steam oxidation on stack 34. The sidewall spacer 44 will only form on those gates which have exposed polysilicon sidewalls. As such, the oxide will not grow on the silicon nitride spacer 46. Therefore the hydrogen will only penetrate stack 34 so that polysilicon 26 becomes doped P+. Stack 33 is unaffected by the hydrogen. As the P+ dopant has not yet diffused into the polysilicon gate conductors by step 108, the polysilicon layer 26 in stack 33 may be either intrinsic polysilicon or it may be polysilicon that has been doped n-type in step 104. Using the method of this embodiment makes it possible to form the sidewall spacers and perform the hydrogen anneal in situ.

Figure 12B:
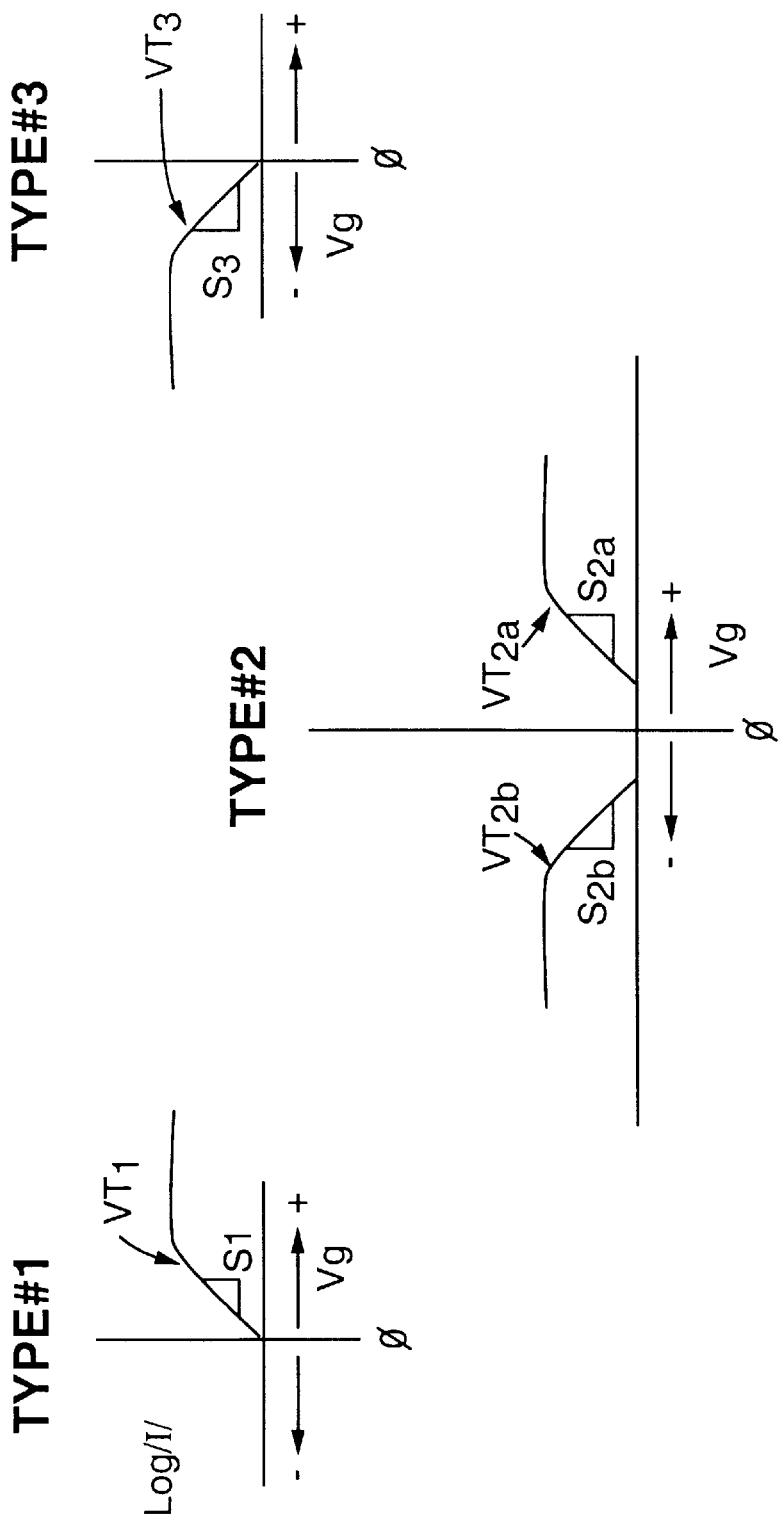

Thus, there are three types of devices which can be formed on the same substrate using the method of the present invention. A type one device includes a silicon nitride spacer formed on the sidewalls of the gate stack and the polysilicon 26 being pre-implanted with N+ dopants. This results in an N+ gate electrode which may be used as part of an NFET, for example the NFET shown in FIG. 7. A graph of the log $|I|$ v. voltage for a type one device is shown in FIG. 12b. The device has a particular turn-on characteristic where Vt is positive and a particular sub-threshold slope labeled S1.

A type three device includes a gate stack similar to stack 34 shown in FIG. 12a. This device type has had the silicon nitride spacer removed and the oxide spacer grown by either steam or wet oxidation. The dopant source has been activated in a manner described above resulting in a P+ gate electrode. A graph of a type three device is also shown in FIG. 12b. A type three device is complementary to the type one device and its graph is essentially a mirror image of a type one device. The type three device has a turn-on voltage VT3 and sub-threshold slope S3 as shown.

A type two device is one in which the silicon nitride spacer is formed on the sidewall and the polysilicon layer 26 remains intrinsic, that is the polysilicon was not doped n-type in step 104. Since the silicon nitride spacer is not removed in this case, the gate electrode is not doped P+ and remains intrinsic. The hydrogen does not penetrate the films and the P+ dopant remains trapped in the dopant source. A type two device may be either a PFET when it is formed in an n-well or an NFET when formed in a P-well. A graph of the log $|I|$ versus voltage for a type two device is also shown in FIG. 12b. A transistor with an intrinsic gate electrode provides a threshold voltage that is constantly offset 0.55 volts from either of a type one or type three devices. The penalty for this is that the sub-threshold slope, S2a for a NFET and S2b for a PFET, is degraded so that S2a is greater than S1 and S2b is greater than S3. The slopes S2a and S2b of the type two devices are approximately equal to each other. Using the method of the present invention, it is possible to form these three different types of devices on the same substrate.

In a modification to the last mentioned embodiment a multiple anneal process may be used to form a fourth type of a device. Here, the positive spacers are removed from selected ones of the gate stacks and activation takes place in the manner described above to dope the intrinsic polysilicon gate conductors of the selected gate stacks p-type. The activation may be either the wet or steam oxidation described above, but is preferably a hydrogen anneal. Next, the positive spacers are removed from more gate structures in addition to aforementioned selected ones and the activating step is repeated again. This results in the selected ones of the gate structures which first had the positive spacer removed being activated twice and having the P+ dopant driven in a little further to form depletion and enhancement devices. This process can be repeated more than twice if desired.

FIGS. 13a and 13b illustrate a multiple anneal process of a gate stack. FIG. 13a shows a selected gate stack in which the silicon nitride spacers has been removed. A first anneal is then performed, preferably the hydrogen anneal, to diffuse the P+ dopant from the dopant source to the polysilicon 26 and convert it to P+. This lowers the magnitude of the threshold voltage of the PFET device below zero volts. Next, silicon nitride spacers are removed from additional gate stacks (not shown) and a second anneal step is performed. Those devices which have had the silicon nitride spacers removed for the first anneal step, such as the stack of 13a, then undergo a second anneal. FIG. 13b shows the same gate stack of FIG. 13a with the second anneal performed. The P+ dopant penetrates the gate electrode and the gate insulating layer to form a P+ layer in the n-well. This results in a threshold voltage shift where Vt is greater than zero volts. The gate stacks which are only subject to the second anneal form type two devices.

Thus, in addition to the three types of devices previously discussed, a fourth device type may be created on the same substrate. By moving the P+ doping through the polysilicon gate and the gate insulating layer into the silicon substrate, a PFET depletion device, that is one that is normally conducting, is created.

Figure 14:
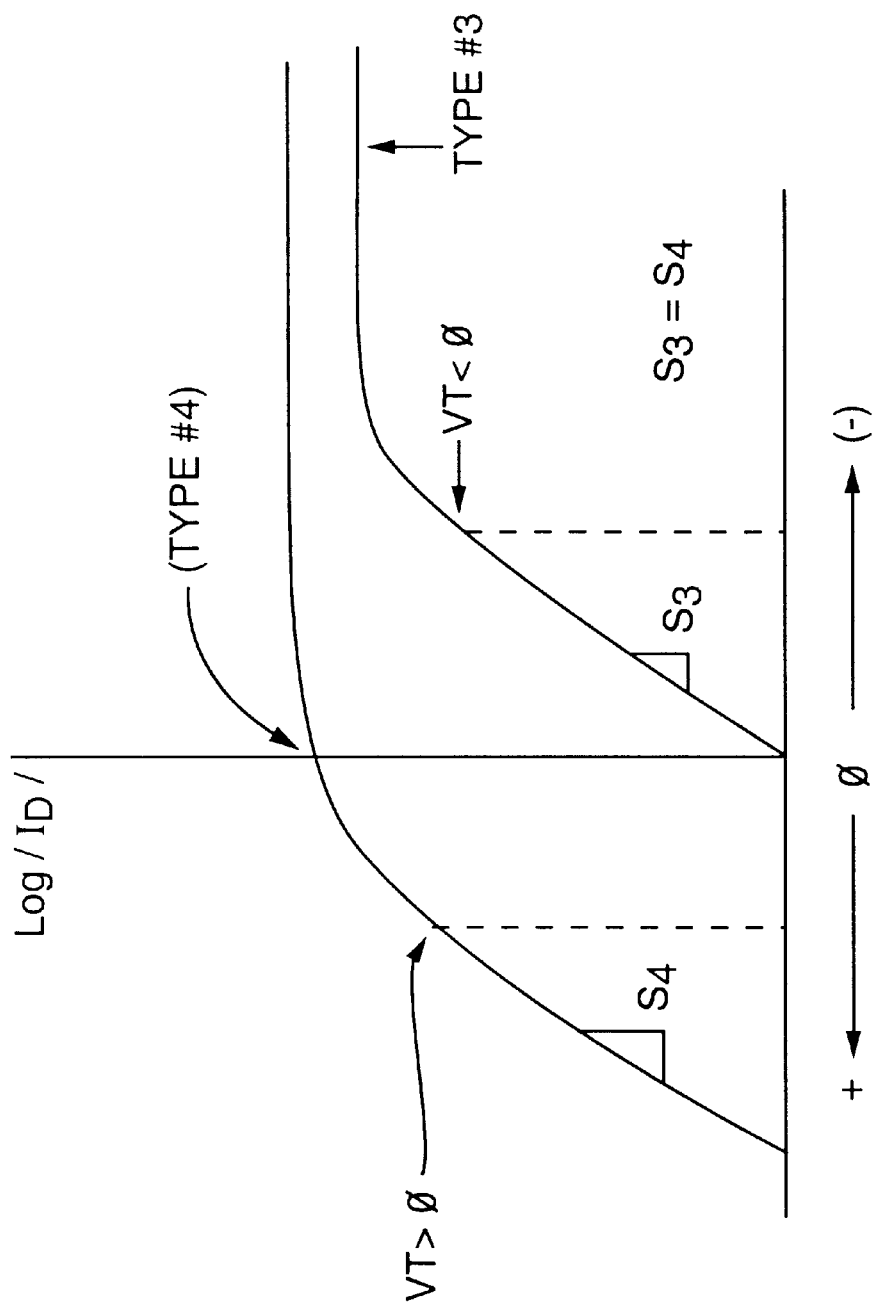
FIG. 14 is a current versus voltage graph of the semiconductor device of FIG. 13b.

FIG. 14 shows the shift of the threshold voltage of a type four device as well as the graph for a type three device. Please note that the voltage axis has been reversed, that is, it is negative in the direction to the right of the figure and positive in the direction to the left of the figure. The type four device is normally on so that at zero gate bias, the device is conducting. Also note that the sub-threshold slope S3 of the type three device equals the sub-threshold slope S4 of the type four device. Thus, there is not penalty of a degraded slope in this case.

The method of the present invention allows enhancement mode and depletion mode FETs to be formed in the same substrate.

Figure 15:
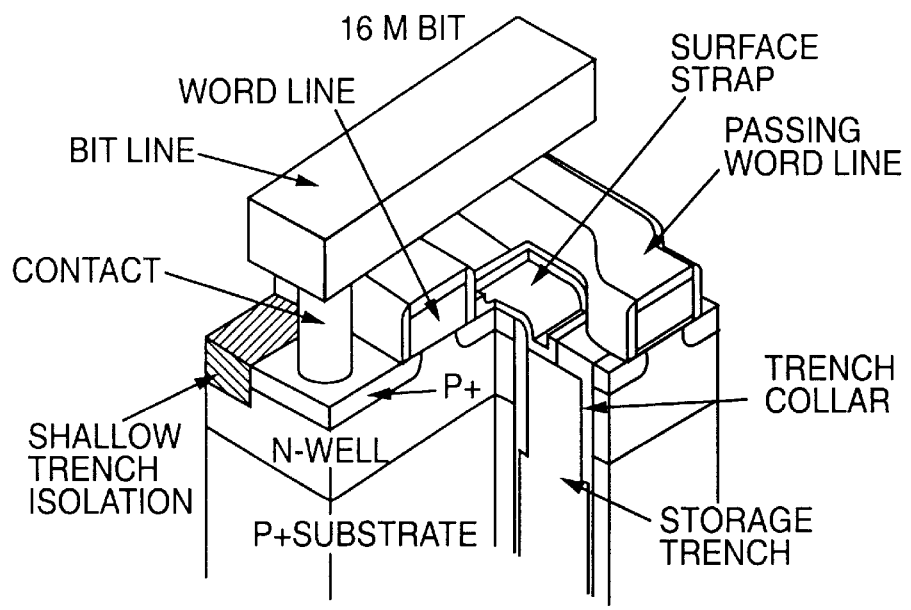
FIG. 15 illustrates a DRAM cell employing a PFET transfer device in an n-well on a P+ substrate.

In a known 16 Mbit technology the DRAM transfer device is a Buried Channel PFETs, having an N+ gate over the P-well region as shown in FIG. 15. It is well known that buried channel Pfet's are not extendible as deep sub-micron transfer devices due to the inherent off-state device leakage, which limits retention time of the cell. However, the cell device complex construction has one plate of the storage trench capacitor connected to a P+ substrate, which is a fundamental logic building block (for low noise, excellent ground plane) and allows for easy integration of a merged DRAM and LOGIC product.

Figure 1:
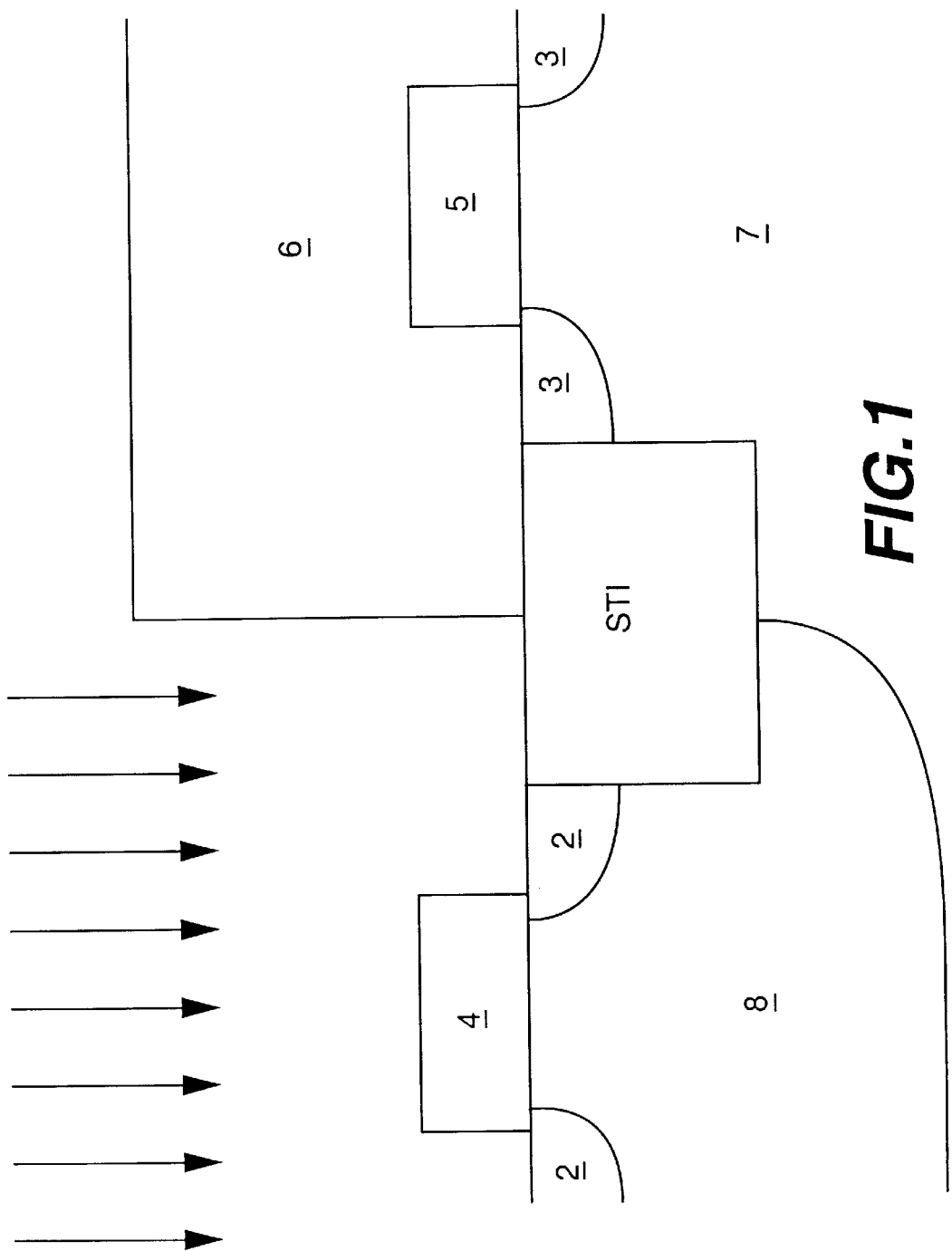
FIG. 1 illustrates a method for separately forming the transistors in a high performance logic device.
Figure 2:
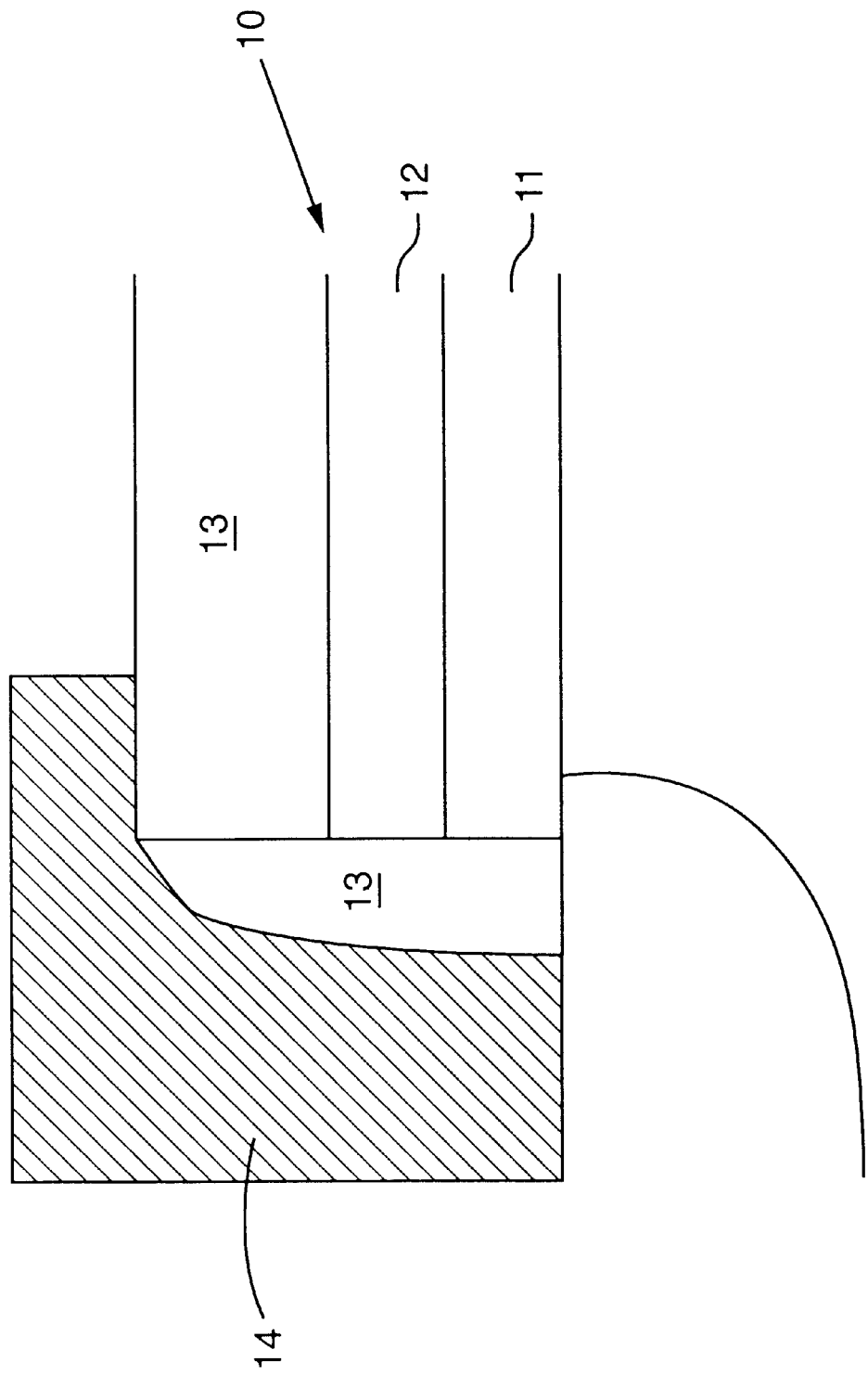
FIG. 2 is a cross-section of a NFET having a borderless contact.
Figure 16:
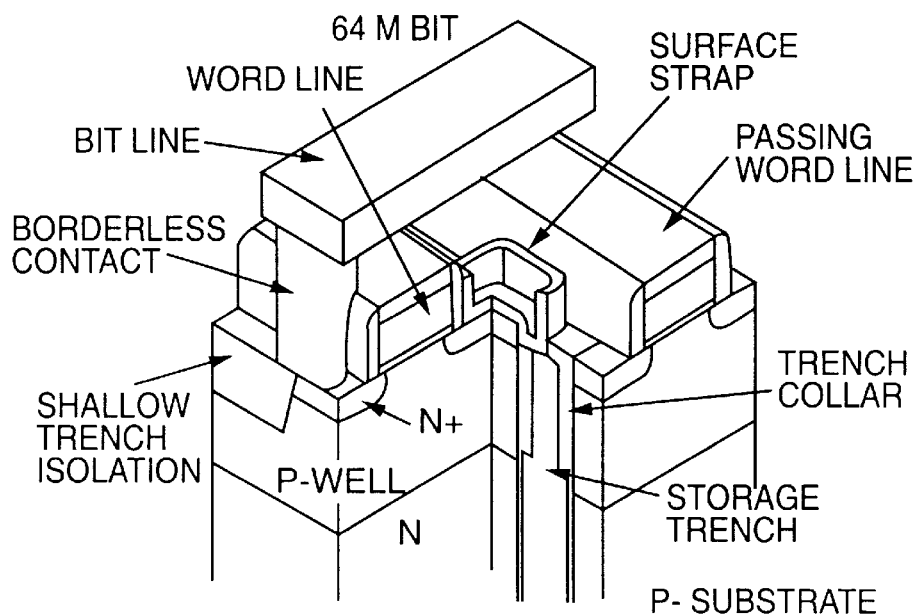
FIG. 16 illustrate a DRAM cell employing an NFET transfer device in a p-well on a p-substrate.

To migrate into deep sub-micron cell designs, a DRAM transfer device as shown in FIG. 16 is employed. This consists of a surface NFET device (thus having superior off-state control), and as contrasted with FIG. 15, the gate electrode is capped so that the bitline contact can be made borderless to the gate electrode (i.e., it does not short to the wordline), thus reducing cell size. This borderless feature is also first discussed in FIG. 2. This cell is designed in a P-substrate. If the substrate were P+, the outer N-cell plate could not be fabricated. Although this cell is ideal for DRAM technology, the well construction and substrate choice are not optimum for Merged DRAM Logic applications. A large redesign is required in the support portion of the design due to the increased susceptibility to latch-up and noise.

Thus, the following constraints are solved by the delayed activation of a P+ polysilicon gate Surface Channel PFET (Device type three of this disclosure).

1) This device is a surface channel (type three) device and has the properties of extending the cell so that the gate length is in the deep sub-micron regime with low (i.e. good) off-state properties.
2) Since the gate (or word-line) is pre-implanted and capped, the cell is made as dense as the 64 Mbit design, and is extendable for future miniaturization
3) Since the cell is a Pfet design, it has the well construction of 16 Mbit, and integrates directly with a merged DRAM and LOGIC technology.

Accordingly, a structure and method for dual work function gate conductors with self-aligned insulating caps for merged high performance logic/high density DRAM applications has been provided. The dopant used to dope the gate conductor is sealed off and can be activated at a later point in the process.

While a preferred embodiment of the invention has been described above, since variations in the invention will be apparent to those skilled in the art, the invention should not be construed as limited to the specific embodiment described above.

We claim:

1. A method of forming a semiconductor device comprising:
   a) forming a gate insulating layer on a substrate;
   b) forming a polysilicon layer on top of said gate insulating layer;
   c) forming a silicide layer on top of said polysilicon layer;
   d) forming a barrier layer on top of said silicide layer;
   e) implanting a dopant of a first conductivity type into selected areas of said polysilicon;
   f) forming a dopant source layer containing a dopant of a second conductivity type on said barrier layer;
   g) forming a capping layer over said dopant source;
   h) defining gate stacks; and
   i) driving said dopant of said second conductivity type through said barrier layer and into said polysilicon layer.

2. The method of claim 1 wherein said barrier layer is about 5–15 nm thick.

3. The method of claim 1 wherein said gate insulating layer comprises an NO film.

4. The method of claim 1 wherein said gate insulating layer comprises an ONO film.

5. The method of claim 1 wherein said dopant source layer is BSG.

6. The method of claim 1 wherein said dopant source layer is $TiB_2$.

7. The method of claim 1 wherein said dopant source layer is SiGeB.

8. The method of claim 1 wherein said dopant source layer is boron doped polysilicon.

9. The method of claim 1 wherein step i) comprises the step of heating the structure formed in step g) in a hydrogen rich atmosphere.

10. The method of claim 1 wherein step i) comprises growing sidewall spacers by wet oxidation.

11. The method of claim 1 wherein step i) comprises growing sidewall spacers by steam oxidation.

12. The method of claim 1 wherein said substrate is a bulk substrate.

13. The method of claim 1 wherein said substrate is an SOI substrate.

14. The method of claim 1 wherein step e) is performed before step d).

15. The method of claim 1 further comprising:
   forming a silicon nitride spacer on said gate stacks after step h);
   removing said silicon nitride spacer from selected ones of said gates stacks;
   growing sidewall spacers on said gate stacks, said growing also serving as part of step i).

16. The method of claim 12 wherein said growing step comprises wet oxidation.

17. The method of claim 12 wherein said growing step comprises steam oxidation.

18. A method for delayed doping of a gate conductor comprising:
   providing a gate stack, including an undoped polysilicon layer, a barrier layer, and a dopant layer, on a substrate;
   enclosing said gate stack with a cap;
   removing said cap from sidewalls of selected gate stacks; and
   performing a hydrogen anneal diffusing dopants from said dopant layer through said barrier layer into said polysilicon layer in said gate stacks with said cap removed.

19. The method of claim 18 further comprising:
   removing said cap from sidewalls of additional ones of said gate stacks; and
   performing a second diffusing step.

20. The method of claim 19 wherein said second diffusing step comprises growing sidewall spacers by steam oxidation; and
   annealing said gate conductor.

21. The method of claim 19 wherein said second diffusing step comprises growing sidewall spacers by wet oxidation; and
   annealing said gate conductor.

22. A method for delayed activation of a gate conductor in a dual work function device comprising:
   separating a gate conductor from an impurity layer with a barrier layer;
   forming a cap layer on top of said impurity layer;
   driving dopants from said impurity layer through said barrier layer into said gate conductor at a predetermined time; and
   preventing said dopants from entering a substrate.

23. A method for delayed activation of a gate conductor in a dual work function device comprising:
   separating a gate conductor from an impurity layer with a barrier layer;
   forming a cap layer on top of said impurity layer;
   driving dopants from said impurity layer through said barrier layer into said gate conductor at a predetermined time; and
   selectively diffusing said dopants into a substrate.

24. A semiconductor device made according to the method of claim 22.

25. A semiconductor device made according to the method of claim 23.

* * * * *

UNITED STATES PATENT AND TRADEMARK OFFICE
CERTIFICATE OF CORRECTION

PATENT NO. : 6,274,467 B1
DATED : August 14, 2001
INVENTOR(S) : Jeffrey P. Gambino et al.

It is certified that error appears in the above-identified patent and that said Letters Patent is hereby corrected as shown below:

Title page,
ABSTRACT,
Line 8, after "n-type" insert -- or --.

Column 3,
Line 60, change "referring" to -- Referring --.

Signed and Sealed this

Twelfth Day of March, 2002

Attest:

JAMES E. ROGAN
*Attesting Officer*   *Director of the United States Patent and Trademark Office*